United States Patent [19]

Sasaki

[11] Patent Number: 5,047,895

[45] Date of Patent: Sep. 10, 1991

[54] FLEXIBLE PRINTED CIRCUIT BOARD

[75] Inventor: Takahide Sasaki, Kanagawa, Japan

[73] Assignee: Canon Kabushiki Kaisha, Tokyo, Japan

[21] Appl. No.: 293,411

[22] Filed: Jan. 4, 1989

[30] Foreign Application Priority Data

Jan. 26, 1988 [JP] Japan .................. 63-8331[U]

[51] Int. Cl.⁵ ............................................. H05K 1/00
[52] U.S. Cl. .................... 361/398; 361/406; 361/408; 439/67; 439/77
[58] Field of Search ............... 361/398, 406, 408, 409, 361/412, 413; 439/67, 65, 77, 493; 174/117 PC, 254, 268

[56] References Cited

U.S. PATENT DOCUMENTS 3,433,888  3/1969  Tally et al. .................. 439/77 X
4,451,714  3/1984  Eventoff ....................... 361/398 X
4,799,129  1/1989  Izumino ........................ 361/413 X

FOREIGN PATENT DOCUMENTS 2014368  8/1979  United Kingdom ................. 439/77

Primary Examiner—Benjamin R. Fuller
Assistant Examiner—Paramita Ghosh
Attorney, Agent, or Firm—Fitzpatrick, Cella, Harper & Scinto

[57] ABSTRACT

A flexible printed circuit board, which has a plurality of signal lines and allows end portions of the signal lines to be electrically connected to another member, is arranged such that an end portion of at least one signal line is made to detour around an end portion of another signal line so as to be introduced into a portion for electrical connection.

5 Claims, 2 Drawing Sheets

FLEXIBLE PRINTED CIRCUIT BOARD

BACKGROUND OF THE INVENTION

1. Field of the Invention

The present invention relates to flexible printed circuit boards, and more particularly to a flexible printed circuit board which allows the order of arrangement of a plurality of conductive patterns on the side of one end thereof and that on the side of the other end thereof to arbitrarily differ from each other without causing the plurality of conductive patterns to cross each other midway in the patterns.

2. Description of the Related Art

Conventionally, as shown in FIG. 1, when a first printed circuit board 2 and a second printed circuit board 2' are to be connected to each other by means of a one-sided flexible circuit board 1, if the order of signal lines of a first flexible circuit board connector (hereinafter referred to as the FPC connector) 4 provided on the first printed circuit board 2 is different from the order of signal lines of a second FPC connector 4' provided on the second printed circuit board 2', as illustrated in FIG. 1 in which the former order is c-b-a (the characters a, b and c being the names of the signal lines) and the latter order is b-a-c, the following procedure is generally taken to rectify the disorder of the signal lines. Namely, as shown in FIG. 1, conductive patterns 1a and 1a' are provided to connect the signal lines a—a, while conductive patterns 1b and 1b' are provided to connect the signal lines b—b, and copper foil lands of the corresponding conductive patterns 1a and 1a' or 1b and 1b' are connected to each other by soldering by means of a plated jumper wire 3 or 3' in such a manner as to straddle a conductive pattern 1c for connecting the signal lines c—c.

With this method, however, there is the drawback that the number of work processes increases since, in order to rectify the disorder of the signal lines, it is necessary to solder plated jumper wires and attach an insulating tape to prevent the jumper wires from coming into contact with other parts such as electrodes and conductive patterns.

In addition, it is also possible to make use of the technique disclosed in Japanese Patent Publication No. Sho 59-30552 without providing any plated jumper wires separately. According to this technique, conductive patterns are cut and raised, as shown in FIG. 2, and tongue portions 1e and 1f of the cut and raised conductive patterns are used in place of the plated jumper wires.

However, even if such conductive patterns are used instead of the plated jumper wires, the number of work processes increases since the conductive patterns must be cut and raised, one end of each of the tongue portions 1e and 1f must be screwed down, and soldering must be carried out.

SUMMARY OF THE INVENTION

Accordingly, an object of the present invention is to provide a flexible printed circuit board which allows the order of arrangement of a plurality of conductive patterns on the side of one end thereof and that on the side of the other end thereof to arbitrarily differ from each other without causing the plurality of conductive patterns to cross each other midway in the patterns.

To this end, according to one aspect of the present invention there is provided a flexible printed circuit board permitting electric connection with other electrical parts, comprising: a plurality of electrode portions for connection with the other electric parts; a plurality of conductive patterns for electrically connecting the plurality of electrode portions to each other; a slit provided around at least one electrode portion of the plurality of electrode portions; and a detour portion separated by the slit from an electrode portion located adjacent to the slit, the detour portion being provided to allow at least one of the plurality of conductive patterns to detour and cause the order of arrangement of the conductive patterns of the electrode portion located adjacent to the slit to differ from the order of arrangement of the conductive patterns of the other corresponding electrode portion.

According to another aspect of the present invention there is provided a flexible printed circuit board which is electrically connected to at least two other printed circuit boards, comprising: a first electrode portion which is connected to a connector of one of the other printed circuit boards; a second electrode portion which is connected to a connector of another of the other printed circuit boards, the order of arrangement of signal lines from the connector to the second electrode portion being different from the order of arrangement of signal lines from the connector to the first electrode portion; a plurality of conductive patterns for electrically connecting the first electrode portion to the second electrode portion; a slit provided around the second electrode portion; and a detour portion separated from the second electrode portion by the slit, the detour portion causing at least one of the plurality of conductive patterns to detour such that the signal lines to the second electrode portion corresponds to the signal lines to the first electrode portion.

The other objects, features and advantages of the present invention will become more apparent from the following detailed description of the invention when read in conjunction with the accompanying drawings.

DETAILED DESCRIPTION OF THE PREFERRED EMBODIMENTS

Referring now to the accompanying drawings, a description will be given of the embodiments of the present invention.

Figure 3:
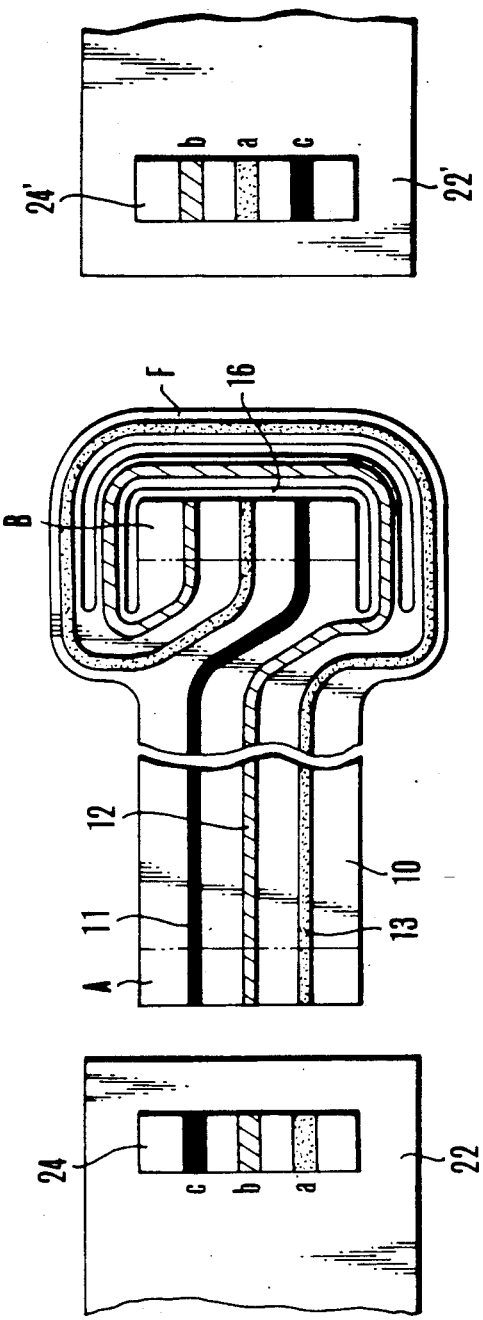
FIG. 3 is a top plan view of a flexible printed circuit board in accordance with an embodiment of the present invention.

FIG. 3 is a top plan view of a flexible printed circuit board in accordance with an embodiment of the present invention.

A one-sided flexible printed circuit board 10 electrically connects a first printed circuit board 22 having a first FPC connector 24 in which the order of arrangement of signal lines is c-b-a to a second printed circuit board 22' having a second FPC connector 24' in which the order of arrangement of signal lines is b-a-c.

This one-sided flexible printed circuit board 10 is arranged such that a first conductive pattern 11, a second conductive pattern 12 and a third conductive pattern 13 are formed in parallel with each other at an electrode portion A at one end thereof in such a manner as to be aligned with the terminals of the first FPC connector 24. The first conductive pattern 11 for connecting the signal lines c—c extends directly to a position corresponding to the signal line c of the second FPC connector 24' at an electrode portion B on the side of the other end thereof without making a detour. The second conductive pattern 12 for connecting the signal lines b—b extends to a position corresponding to the signal line b of the second FPC connector 24' by detouring around the front of the other electrode portion B. The third conductive pattern 13 for connecting the signal lines a—a detours around the front of the other electrode portion B along the outside of the second conductive pattern 12, and its tip portion extends to a position corresponding to the signal line a of the second FPC connector 24' in such a manner as to go round to be located on the inside of the tip portion of the second conductive pattern 12.

Thus, since a detour portion F is formed in the conductive patterns, it is possible to change the order of the wiring without installing jumper wires. In addition, if the detour portion F located in front of the other electrode portion B is bent, it is possible to readily effect connection with the second FPC connector 24' or the second printed circuit board 22'.

Thus, the electrode portion B of the one-sided flexible printed circuit board 10 is formed at an end portion in which its tip portion is located at the detour portion F of the conductive patterns, and a continuous slit 16 is formed around the three sides of the electrode portion B, this slit 16 serving to separate the electrode portion B from the detour portion F. In addition, the detour portion F is bent at this slit 16 to allow the electrode portion B to be connected to the second FPC connector 24'.

Figure 4:
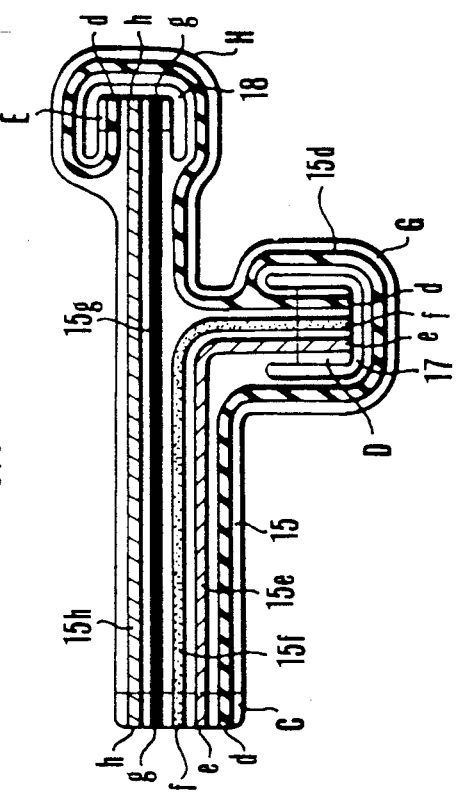
FIG. 4 is a top plan view of a flexible printed circuit board in accordance with another embodiment of the present invention.

Referring now to FIG. 4, a description will be given of another embodiment of the present invention.

FIG. 4 is a top plan view of a flexible printed circuit board in accordance with another embodiment of the present invention.

A one-sided flexible printed circuit board 15 in accordance with this embodiment has five types of signal lines d, e, f, g and h, and it is assumed that this flexible printed circuit board 15 is connected to other printed circuit boards at electrode portions C, D and E at three end portions thereof by means of a known method. At the electrode portion C, all five types of signal lines are arranged in the order of h-g-f-e-d; at the electrode portion D, the signal lines are arranged in the order of d-f-e; and at the electrode portion E, the signal lines are arranged in the order of d-h-g.

In this case, conductive patterns 15h and 15g for connecting the signal lines h—h and g—g between the electrode portions C and E are formed without making a detour. In addition, conductive patterns 15f and 15e for connecting the signal lines f—f and e—e between the electrode portions C and D are formed without making a detour. Furthermore, a conductive pattern 15d for connecting the signal lines d—d—d among the electrode portions C, D and E is made to detour around the front of the electrode portion D along the outside of the conductive pattern 15e and is also made to detour around the front of the electrode portion E so as to extend to be located adjacent to the conductive pattern 15h. Also, the conductive pattern 15d is branched off midway at the electrode portion D.

In the case of this embodiment as well as the above-described embodiment, the electrode portions D and E of the one-sided flexible printed circuit board 15 are formed in end portions in which tip portions thereof are located at the detour portions G and H of the conductive patterns. In addition, continuous slits 17 and 18 are provided in such a manner as to surround the three sides of the electrode portions D and E, and the electrode portions D and E are separated from the detour portions G and H by means of these slits 17 and 18, respectively. In addition, the detour portions G and H are bent at these slits 17 and 18 to allow the electrode portions D and E to be connected to other printed circuit boards.

As described above, in accordance with the present invention, since a detour portion is formed, it is possible to rearrange the order of arrangement of signal lines without installing jumper wires as in the case of the conventional art, thereby making it possible to effect a reduction in production costs. In addition, since a detour portion is flexible, connection can be effected readily by bending the detour portion.

What is claimed is:

1. A flexible printed circuit board permitting electric connections with other electrical parts, comprising:
   a plurality of electrode portions;
   a plurality of conductive patterns for electrically connecting said plurality of electrode portions to each other;
   a slit provided around and adjacent to at least one electrode portion of said plurality of electrode portions; and
   a detour portion separated by said slit from said at least one electrode portion located adjacent to said slit, said detour portion being provided to allow at least one of said plurality of conductive patterns to detour and cause an order of arrangement of said conductive patterns of said at least one electrode portion located adjacent to said slit to differ from an order of arrangement of said conductive patterns of other corresponding electrode portions.

2. A flexible printed circuit board according to claim 1, which is capable of being connected to printed circuit boards having connectors, with said electrode portion located adjacent to said slit being connected to one of the connectors.

3. A flexible printed circuit according to claim 2, wherein said detour portion has a bent portion so as to allow an electrode portion to be connected to one of the connectors.

4. A flexible printed circuit board which is electrically connected to at least two printed circuit boards, comprising:
   a first electrode portion which is connected to a connector of one of the two printed circuit boards;
   a second electrode portion which is connected to a connector of another of two printed circuit boards, the two of arrangement of signal lines from said connector said second electrode portion being different from the order of arrangement of signal lines from said connector to said first electrode portion;
   a plurality of conductive patterns for electrically connecting said first electrode portion to said second electrode portion;
   a slit provided around said second electrode portion; and a detour portion separated from said second electrode portion by said slit, said detour portion causing at least one of said plurality of conductive patterns to detour such that said signal lines to said second electrode portion corresponds to said signal lines to said first electrode portion.

5. A flexible printed circuit board according to claim 4, wherein said detour portion has a bent portion so as to allow a detour portion to be connected to said second electrode portion.

* * * * *

UNITED STATES PATENT AND TRADEMARK OFFICE
CERTIFICATE OF CORRECTION

PATENT NO. : 5,047,895

DATED : September 10, 1991

INVENTOR(S) : Takahide Sasaki

Figure 1:
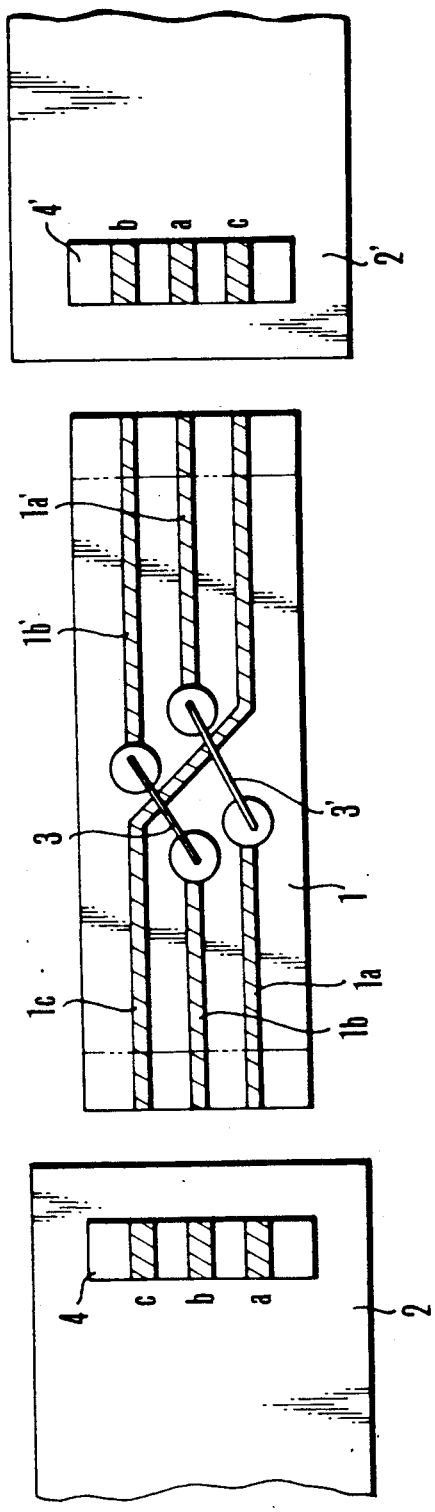
FIG. 1 is a top plan view illustrating a conventional flexible printed circuit board.
Figure 2:
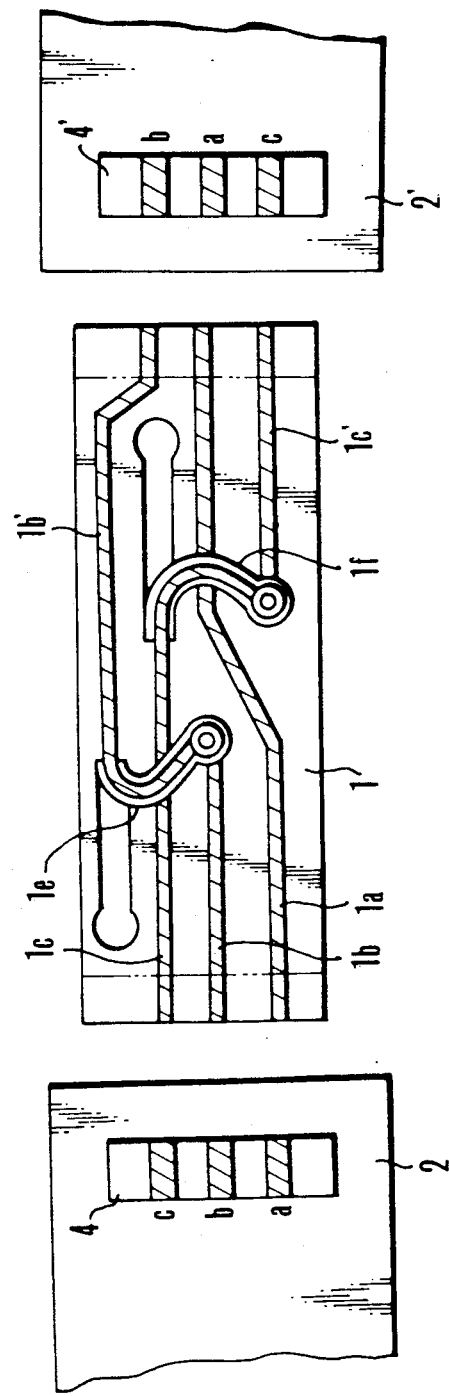
FIG. 2 is a top plan view of a flexible printed circuit board illustrating another conventional example.

It is certified that error appears in the above-identified patent and that said Letters Patent is hereby corrected as shown below:

In the Drawings:

SHEET 1:

Fig. 1, "FIG. 1" should read --FIG. 1 PRIOR ART-- and "FIG. 2" should read --FIG. 2 PRIOR ART--.

COLUMN 2:

Line 35, "corresponds" should read --correspond--.

COLUMN 4:

Line 26, "electric" should read --electrical--.

Line 27, "with other electrical parts," should be deleted.

Line 49, "flexible printed circuit" should read --flexible printed circuit board--.

Line 59, "of two" should read --of the two--.

Line 60, "the two" should read --an order--.

Line 62, "the" should read --an--.

UNITED STATES PATENT AND TRADEMARK OFFICE
CERTIFICATE OF CORRECTION

PATENT NO. : 5,047,895

DATED : September 10, 1991

INVENTOR(S) : Takahide Sasaki

It is certified that error appears in the above-identified patent and that said Letters Patent is hereby corrected as shown below:

COLUMN 6:

Line 1, "corresponds" should read --correspond--.

Signed and Sealed this

Twenty-eighth Day of December, 1993

Attest:

BRUCE LEHMAN

Attesting Officer

Commissioner of Patents and Trademarks